United States Patent
Yamaguchi et al.

(10) Patent No.: US 7,952,457 B2
(45) Date of Patent: May 31, 2011

(54) COIL COMPONENT

(75) Inventors: Kenichi Yamaguchi, Tokyo (JP); Nobuo Kitajima, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/639,070

(22) Filed: Dec. 16, 2009

(65) Prior Publication Data
US 2010/0156584 A1    Jun. 24, 2010

(30) Foreign Application Priority Data
Dec. 24, 2008  (JP) ................ 2008-327971

(51) Int. Cl.
*H01F 27/30* (2006.01)
*H01F 27/02* (2006.01)
*H01F 5/00* (2006.01)
(52) U.S. Cl. ........... 336/196; 336/83; 336/198; 336/200
(58) Field of Classification Search .................... 336/83, 336/192, 198, 200
See application file for complete search history.

(56) References Cited

U.S. PATENT DOCUMENTS

| | | | |
|---|---|---|---|
| 6,559,479 B1 * | 5/2003 | Ludemann | 257/99 |
| 6,876,555 B2 * | 4/2005 | Matsumoto et al. | 361/782 |
| 7,061,358 B1 * | 6/2006 | Yang | 336/198 |
| 2007/0126542 A1 * | 6/2007 | He et al. | 336/83 |

FOREIGN PATENT DOCUMENTS

| | | |
|---|---|---|
| JP | 62-91421 U | 6/1967 |
| JP | 53-146128 A | 12/1978 |
| JP | 3-79404 U | 8/1991 |
| JP | 2001-57310 A | 2/2001 |
| JP | 2001-307922 A | 11/2001 |

* cited by examiner

*Primary Examiner* — Elvin G Enad
*Assistant Examiner* — Ronald W Hinson
(74) *Attorney, Agent, or Firm* — Leydig, Voit & Mayer, Ltd.

(57) ABSTRACT

A coil component that can be mounted on a printed circuit board, with a part in an aperture of the printed circuit board. The coil component includes a first flange on an upper side and a second flange. Terminal boards are on respective opposite sides of the first flange. Terminals respectively project in a direction perpendicular to an axial direction of a winding drum, from the terminal boards and bend and are inserted into through-holes of the printed circuit board. First and second touching surfaces, which are parts of a downside surface of the second flange, touch an upside surface of the printed circuit board.

4 Claims, 8 Drawing Sheets

FIG.1A
Top Perspective View

Fig.1B
Bottom Perspective View

Fig.2A Top View

Fig.2B Left Side View

Fig.2C Elevation View

Fig.2D Right Side View

Fig.2E Bottom View

Fig. 3A
Top Perspective View

Downward Direction ↓

100 Coil Component

Fig. 3B
Bottom Perspective View

100 Coil Component

Fig.4A
Top View

Fig.4B
Left Side View

Fig.4C
Elevation View

Fig.4D
Right Side View

Fig.4E
Bottom View

COIL COMPONENT

BACKGROUND OF THE INVENTION

1. Field of the Invention

The present invention relates to a coil component used as a choke coil or a transformer (e.g., a resonance transformer used in a resonance type power supply), etc.

2. Description of the Related Art

From the point of view of lowering height, there are some cases where a choke coil or a transformer in a power supply of flat panel televisions etc is mounted on a printed circuit board, with a part thereof in an aperture of the printed circuit board. The first patent document, Japanese Patent Application Laid-Open No. 2001-57310 relates to a transformer which is simply mounted on the board or a part of which is in an aperture of the board. The first patent document says that the transformer has no conduction fault, because a part of each terminal is like spring or because the terminals are partially thin to be springy so that the terminal and the board steadily touch each other when the transformer is mounted on the board.

In the case where the terminals are partially springy like the transformer in the first patent document, even if the terminal and the board steadily touch each other, there is a problem that a connection between the terminals and the board is easy to be cut off because force of vibration or shock after soldering is applied to the soldering part connecting the terminals and the board. Another problem is that whole weight of the transformer should be supported by the terminals, which applies much force to the terminals. Moreover, there is a problem that mounting condition of the transformer is so unstable that accuracy of height is bad.

The second patent document, Japanese Patent Application Laid-Open No. 2001-307922 relates to a method of mounting a coil element, in which a winding is directly given to a drum core, in an opening of a printed circuit board. However, the second patent document cannot solve above problems of the transformer like the first patent document which uses bobbin in addition to a magnetic core and in which winding ends are bound to terminals fitted to the bobbin.

SUMMARY OF THE INVENTION

The present invention has been made in view of the foregoing circumstances and problems, and an object thereof is to provide a coil component which can improve reliability of connection between a terminal and a printed circuit board by reducing force applied to a part connecting the terminal and the printed circuit board, and which can reduce a load on the terminal, and moreover which can be mounted so stably that accuracy of height is good.

An embodiment of the present invention relates to a coil component. The coil component includes: a bobbin which has a winding drum, a first and second flanges respectively on both sides of the winding drum, a terminal board on the first flange, and a terminal sticking out from the terminal board; a winding which is given to the winding drum of the bobbin and whose end is electrically connected to the terminal; and a magnetic core whose central leg is inserted into the bobbin and whose side leg surrounds the bobbin. The coil component can be mounted on a printed circuit board, with a part thereof in an aperture of the printed circuit board. While a mounting-direction of the coil component is defined as downward direction, the first flange is on upper side compared with the second flange, the terminal extends downward to be inserted into a through-hole of the printed circuit board, and a downside surface of the second flange partly touches an upside surface of the printed circuit board.

In the coil component according to the embodiment, a first touching surface including a first portion which is a part of an edge of the second flange and a second touching surface including a second portion which is a part of an edge of the second flange and which is on an opposite side of the first portion may touch the upside surface of the printed circuit board.

In the coil component according to the embodiment, the terminal may be an L-pin type terminal.

In the coil component according to the embodiment, the magnetic core may be a combination of a first core which is an E-type core and a second core which is an E-type core or an I-type core, and the central leg of the E-type core may be inserted into the bobbin.

It is to be noted that any arbitrary combination of the above-described structural components as well as the expressions according to the present invention changed among a system and so forth are all effective as and encompassed by the present embodiments.

According to the embodiments described above, the terminal board is on the first flange which is on upper side compared with the second flange, the terminal sticking out from the terminal board extends downward to be inserted into the through-hole of the printed circuit board, and the downside surface of the second flange partly touches an upside surface of the printed circuit board, therefore weight of the coil component is supported by the downside surface of the second flange. As a result, force applied to a part connecting the terminal and the printed circuit board is so reduced that reliability of connection between the terminal and the printed circuit board can be improved. Moreover, a load on the terminal can be reduced and the coil component can be mounted so stably that accuracy of height is good.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, the drawings in which.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

Figure 1A:
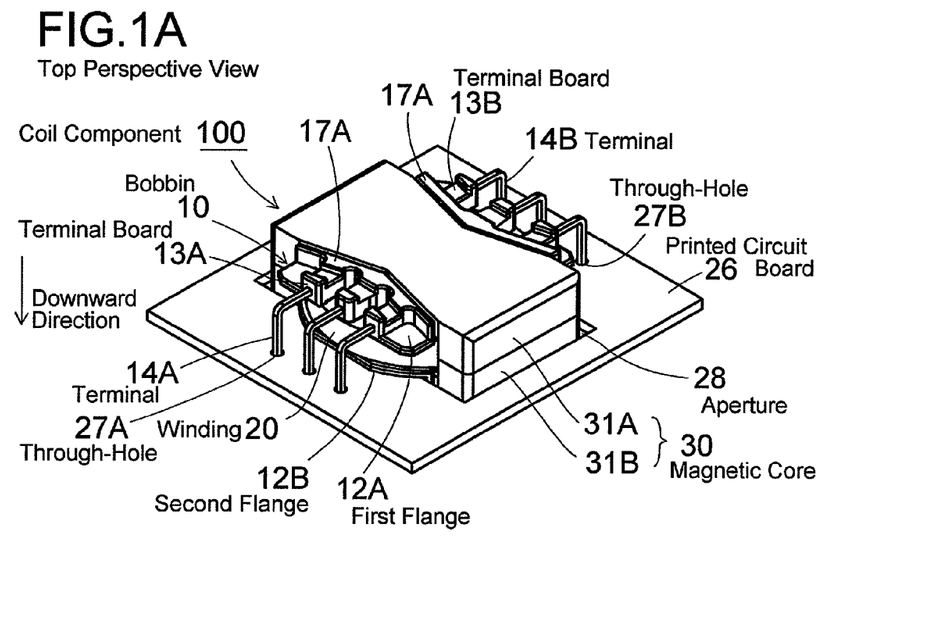
FIG. 1A is a top perspective view of a coil component (already mounted on a printed circuit board) according to an embodiment of the present invention.
Figure 1B:
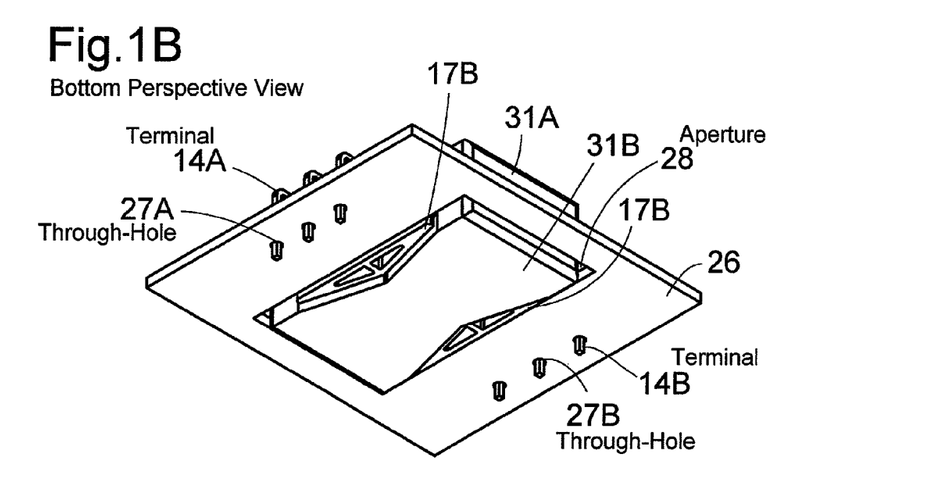
FIG. 1B is a bottom perspective view thereof.
Figure 2A:
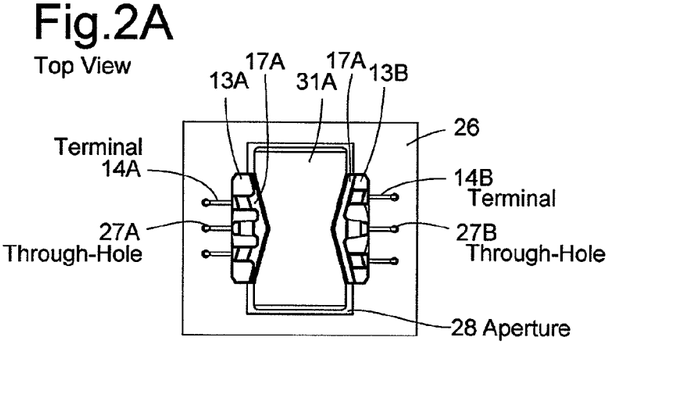
FIG. 2A is a top view of the coil component (already mounted on the printed circuit board)
Figure 2B:
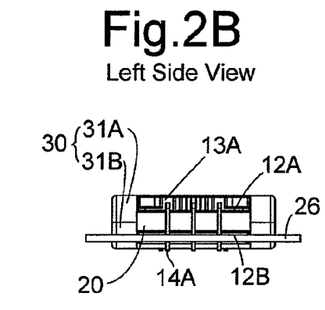
FIG. 2B is a left side view thereof.
Figure 2C:
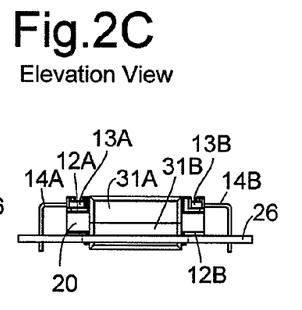
FIG. 2C is an elevation view thereof.
Figure 2D:
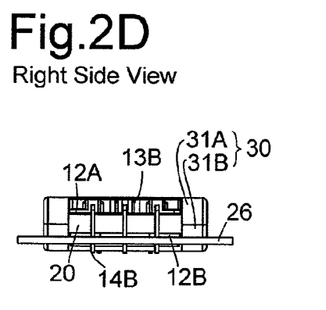
FIG. 2D is a right side view thereof.
Figure 2E:
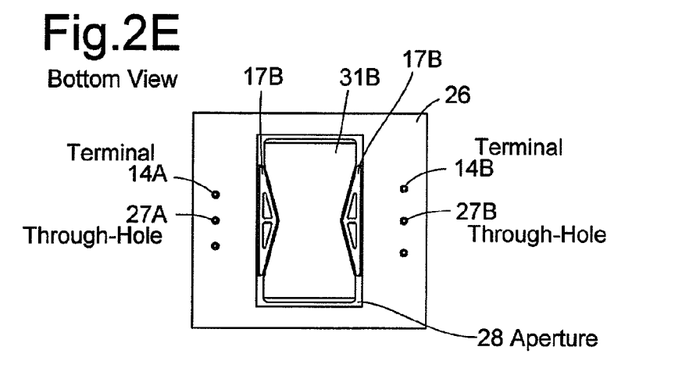
FIG. 2E is a bottom view thereof.
Figure 3A:
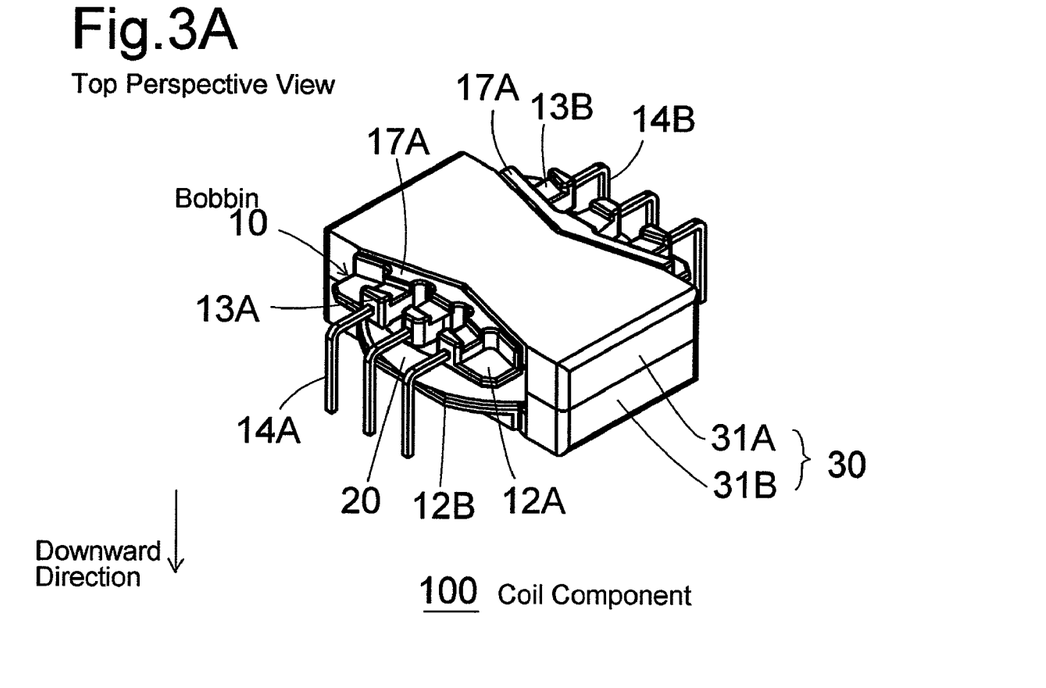
FIG. 3A is a top perspective view of the coil component (not yet mounted on the printed circuit board)
Figure 3B:
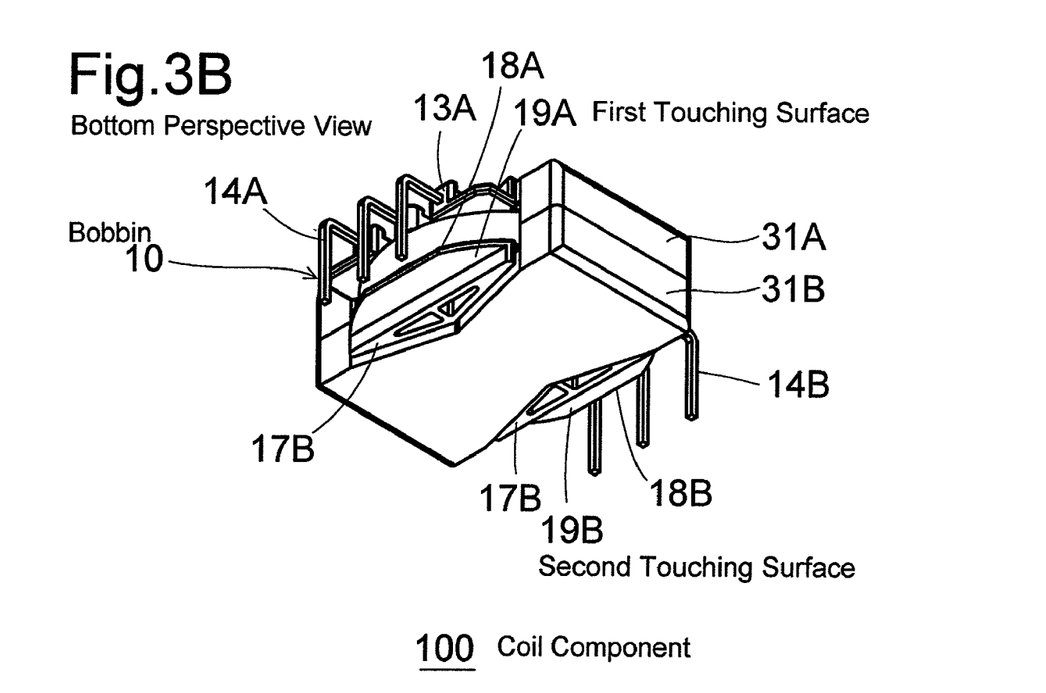
FIG. 3B is a bottom perspective view thereof.
Figure 4A:
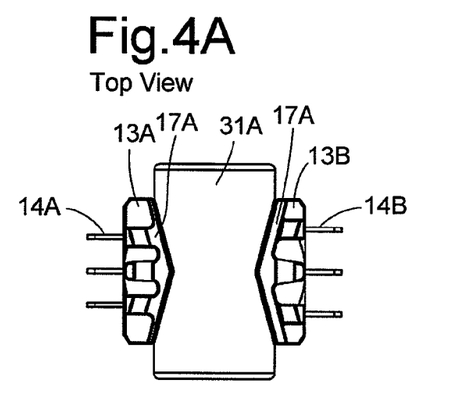
FIG. 4A is a top view of the coil component (not yet mounted on the printed circuit board)
Figure 4B:
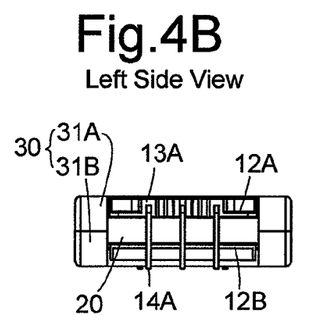
FIG. 4B is a left side view thereof.
Figure 4C:
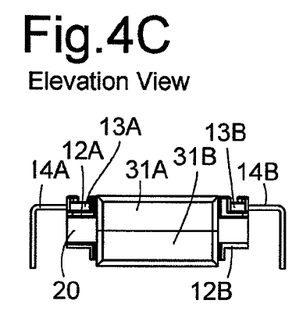
FIG. 4C is an elevation view thereof.
Figure 4D:
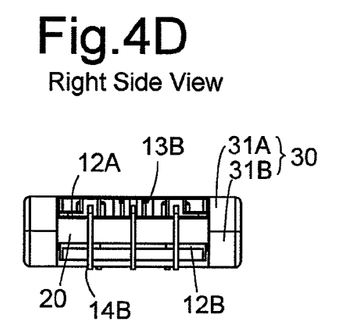
FIG. 4D is a right side view thereof.
Figure 4E:
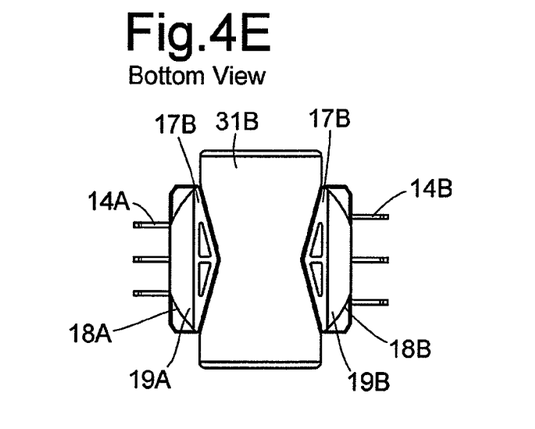
FIG. 4E is a bottom view thereof.
Figure 5:
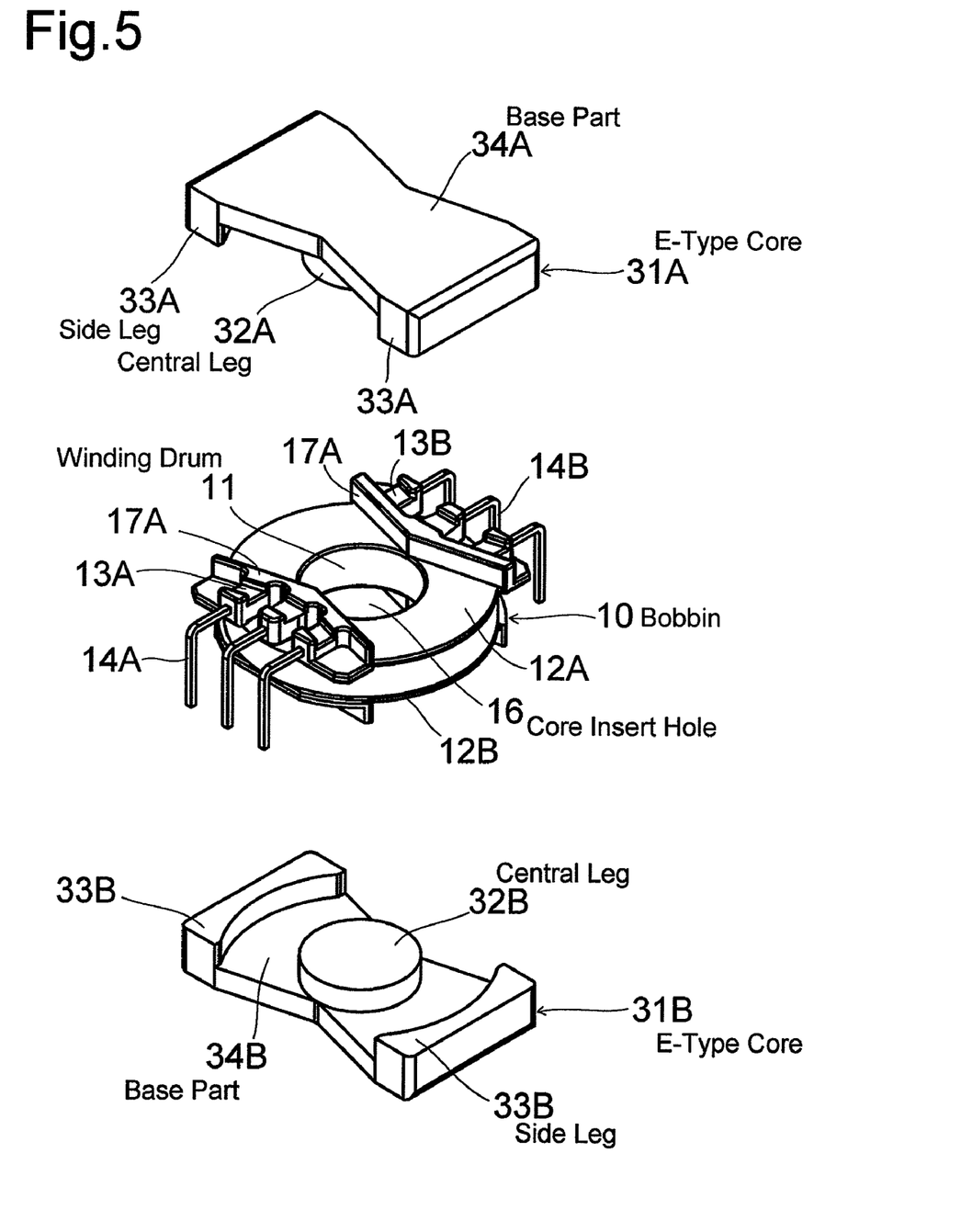
FIG. 5 is an exploded perspective view of the coil component from its top side.
Figure 6:
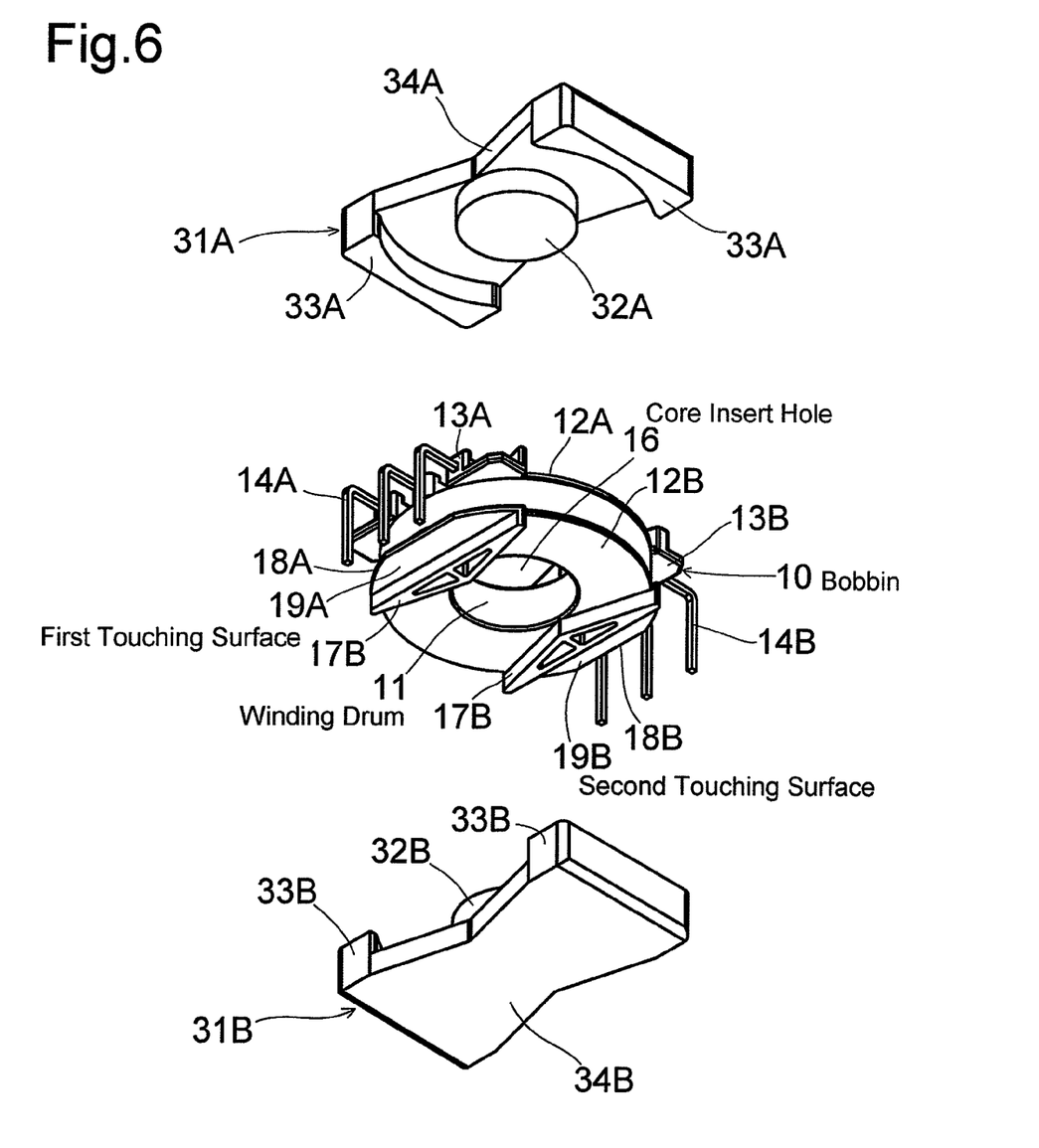
FIG. 6 is an exploded perspective view of the coil component from its bottom side.

FIG. 1A is a top perspective view of a coil component 100 (already mounted on a printed circuit board 26) according to an embodiment of the present invention, and FIG. 1B is a bottom perspective view thereof. FIG. 2A is a top view of the coil component 100 (already mounted on the printed circuit board 26), FIG. 2B is a left side view thereof, FIG. 2C is an elevation view thereof, FIG. 2D is a right side view thereof, and FIG. 2E is a bottom view thereof. FIG. 3A is a top perspective view of the coil component 100 (not yet mounted on the printed circuit board 26), and FIG. 3B is a bottom perspective view thereof. FIG. 4A is a top view of the coil component 100 (not yet mounted on the printed circuit board 26), FIG. 4B is a left side view thereof, FIG. 4C is an elevation view thereof, FIG. 4D is a right side view thereof, and FIG. 4E is a bottom view thereof. Note that in FIG. 2A to FIG. 2E and in FIG. 4A to FIG. 4E a rear view is omitted because it is symmetrical to the elevation view. FIG. 5 is an exploded perspective view of the coil component 100 from its top side. FIG. 6 is an exploded perspective view thereof from its bottom side.

The coil component 100 of the embodiment is such a type that it can be mounted on the printed circuit board 26, whose size is voluntary, with a part thereof dropped in an aperture 28 of the printed circuit board 26. Note that a mounting-direction of the coil component 100 toward the printed circuit board 26 is defined as downward direction. And in the embodiment the coil component 100 is a choke coil.

The coil component 100 includes a bobbin 10, a winding 20, and a magnetic core 30. The bobbin 10, which for example consists of insulating resin compact, has a winding drum 11 (only shown in FIG. 5 and FIG. 6), first and second flanges 12A, 12B, terminal boards 13A, 13B, terminals 14A, 14B, and a core insert hole 16 (only shown in FIG. 5 and FIG. 6).

The first and second flanges 12A, 12B are respectively on both sides of the winding drum 11. An axial direction of the winding drum 11 is perpendicular to a surface of the printed circuit board 26. The first flange 12A is on upper side compared with the second flange 12B. The terminal boards 13A, 13B are respectively on both sides of the first flange 12A. The terminals 14A, 14B, which are for example copper or copper alloy (brass, phosphor bronze or the like) or iron (a surface thereof is given coat of copper, tin or the like), respectively stick out from the terminal boards 13A, 13B.

The terminals 14A, 14B stick out for example in a direction perpendicular to the axial direction of the winding drum 11 from the terminal boards 13A, 13B and then bend downward to be inserted into through-holes 27A, 27B of the printed circuit board 26. The terminals 14A, 14B may be L-pin type terminals. The winding 20 is given to the winding drum 11, and ends thereof are bound and electrically connected by for example soldering to one or both of the terminals 14A, 14B. Note that before the winding 20 is given, the terminals 14A, 14B only stick out in the direction perpendicular to the axial direction of the winding drum 11 from the terminal boards 13A, 13B, not bending downward, and after the winding 20 is given, the terminals 14A, 14B bend downward to become L-pin type terminals. As shown in FIG. 5 and FIG. 6, the core insert hole 16 is through inside of the winding drum 11 (inside of the bobbin 10).

The magnetic core 30 is for example a combination of two E-type cores 31A, 31B consisting of ferrite or the like. Central legs 32A, 32B (see FIG. 5 and FIG. 6) of the E-type cores 31A, 31B are inserted into the core insert hole 16 of the bobbin 10, and side legs 33A, 33B (see the same Figures) thereof are face-to-face with each other so that they surround the bobbin 10 with base parts 34A, 34B to become closed magnetic path. Note that projections 17A, 17B are respectively on the first and second flanges 12A, 12B, and the E-type cores 31A, 31B are so positioned by the projections 17A, 17B as not to rotate against the bobbin 10.

As shown in FIG. 3B and FIG. 6, a downside surface of the second flange 12B has a first touching surface 19A including a first portion 18A which is a part of an edge of the second flange 12B, and a second touching surface 19B including a second portion 18B which is a part of an edge of the second flange 12B and which is on an opposite side of the first portion 18A. The first and second touching surfaces 19A, 19B touch an upside surface of the printed circuit board 26. That is, the coil component 100 is such structure that the downside surface of the second flange 12B partially touches the upside surface of the printed circuit board 26, and a part below the first and second touching surfaces 19A, 19B is dropped in the aperture 28 of the printed circuit board 26 when the coil component 100 is mounted thereon.

As a result of the embodiment of the present invention, the following effects can be obtained.

(1) The terminal boards 13A, 13B are on the first flange 12A above the second flange 12B, the terminals 14A, 14B sticking out from the terminal boards 13A, 13B extend downward to be inserted into the through-holes 27A, 27B of the printed circuit board 26, and the first and second touching surfaces 19A, 19B which are parts of the downside surface of the second flange 12B touch the upside surface of the printed circuit board 26, so that weight of the coil component 100 can be supported by the downside surface of the second flange 12B (the first and second touching surfaces 19A, 19B). Therefore, force applied to a part connecting the terminals 14A, 14B and the printed circuit board 26 is so reduced that reliability of connection between the terminals 14A, 14B and the printed circuit board 26 is improved. Note that if the terminal boards 13A, 13B were arranged on a downside surface of the second flange 12B, it would be impractical that the downside surface of the second flange 12B would touch the printed circuit board 26 because projections or the like would be needed on the downside surface of the second flange 12B in order to lead ends of the winding 20 to the terminals 14A, 14B.

(2) A load on the terminals 14A, 14B is reduced, and the coil component 100 can be mounted so stably that accuracy of height is good. That is, the accuracy of height of the coil component 100 when it is mounted on the printed circuit board 26 is good because depth of a part which is in the aperture 28 of the printed circuit board 26 is determined by height of the downside surface of the second flange 12B of the bobbin 10 which is a resin compact or the like. From this aspect, in the case of structure like the first patent document, height of mounting is so unstable that it easily changes for example by 0.5 mm in error because the height depends on how a terminal bends. Moreover, the height may shift because form of the terminal is changed when ends of the winding is bound to the terminal.

From the point of view of lowering height in recent years, no or few margins of height are allowed. Therefore it is important to improve accuracy of height in order to raise a yield and speed up manufacture.

Figure 7:
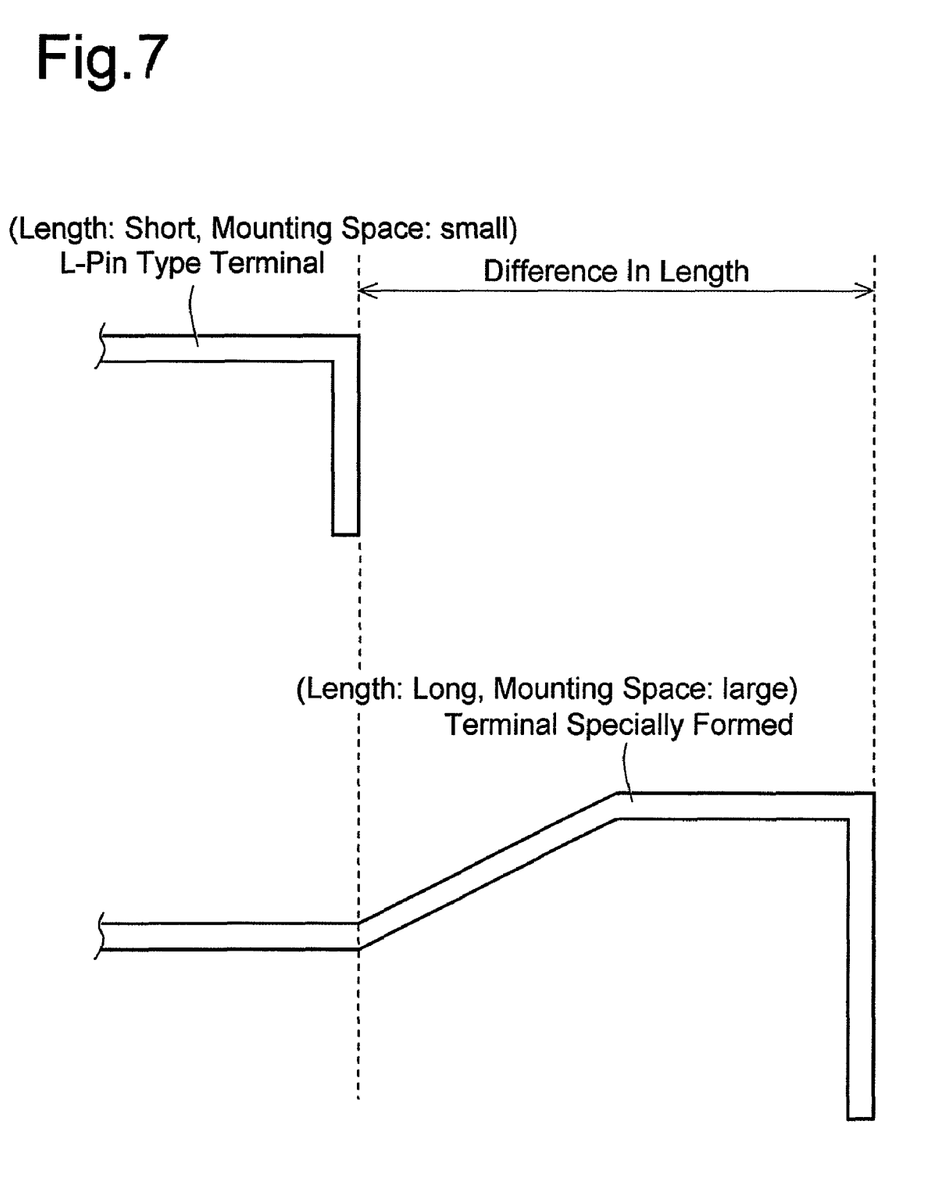
FIG. 7 is a comparison view comparing a L-pin type terminal of the coil component with a terminal which is specially formed in order to make a part of the coil component in an aperture of the printed circuit board.

(3) As the terminal boards 13A, 13B are on the first flange 12A above the second flange 12B, unlike the case where the terminal boards 13A, 13B are arranged on a downside surface of the second flange 12B, common L-pin type terminals can be used as the terminals 14A, 14B sticking out from the terminal boards 13A, 13B. That is, it is not necessary to specially form terminals in order to position a part of the coil component 100 in the aperture 28 of the printed circuit board 26. Therefore, a mounting space on the printed circuit board 26 is small (see FIG. 7).

Described above is an explanation based on the embodiment. The description of the embodiments is illustrative in nature and various variations in constituting elements and processes involved are possible. Those skilled in the art would readily appreciate that such variations are also within the scope of the present invention.

While the coil component 100 is a choke coil in the embodiment, it may be a transformer.

While the magnetic core 30 is a combination of E-type cores 31A, 31B in the embodiment, it may be a combination of an E-type core and an I-type core.

Figure 8A:
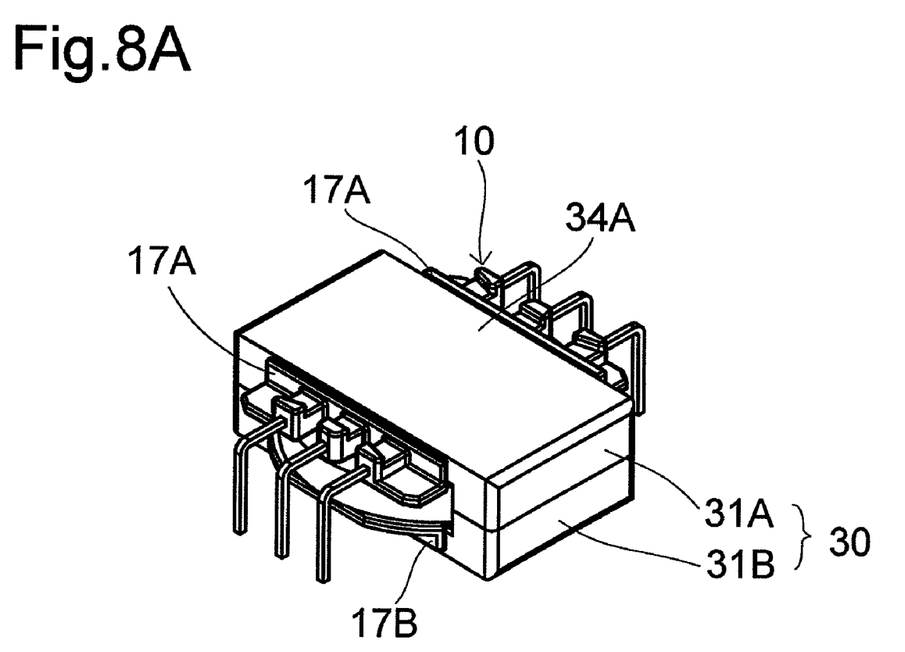
FIG. 8A is a top perspective view of a coil component (not yet mounted on the printed circuit board) according to another embodiment of the present invention.
Figure 8B:
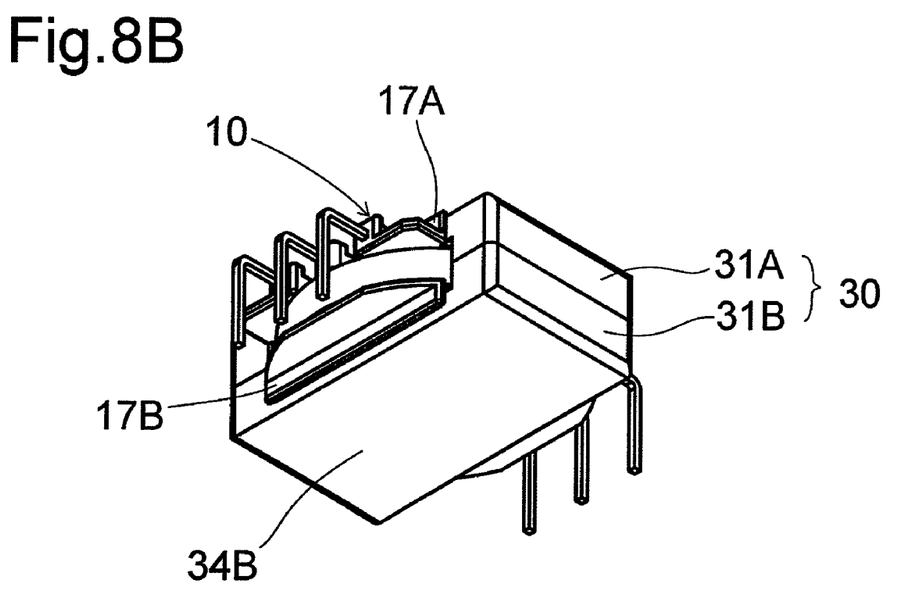
FIG. 8B is a bottom perspective view thereof.

While width of the base parts 34A, 34B of the E-type cores 31A, 31B is narrow at a center thereof compared with ends thereof, width of the base parts 34A, 34B may be constant (straight form) as shown in FIG. 8. In this case, form of the projections 17A, 17B of the bobbin 10 should be straight form along with the base parts 34A, 34B.

What is claimed is:

1. A coil component comprising:
    a bobbin including a winding drum, first and second flanges on respective opposite sides of the winding drum, a terminal board on the first flange, and a terminal projecting from the terminal board;
    a winding on the winding drum of the bobbin and having an end electrically connected to the terminal; and
    a magnetic core having a central leg inserted into the bobbin and a side leg surrounding the bobbin, wherein
        the coil component can be mounted on a printed circuit board, with a part of the coil component in an aperture of the printed circuit board, and
        when a mounting-direction of the coil component is defined as a downward direction and the first flange is on an upper side compared with the second flange, the terminal extends downward and is inserted into a through-hole of the printed circuit board, and a downside surface of the second flange partly touches an upside surface of the printed circuit board.

2. The coil component according to claim 1, comprising a first touching surface including a first portion, which is a part of an edge of the second flange, and
    a second touching surface including a second portion, which is a part of an edge of the second flange, and which is on an opposite side of the first portion, wherein the first and second touching surfaces touch the upside surface of the printed circuit board.

3. The coil component according to claim 1, wherein the terminal is an L-shaped pin terminal.

4. The coil component according to claim 1, wherein the magnetic core includes a first core which is an E-shaped core and a second core which is one of an E-shaped core and an I-shaped core, and
    the central leg of the E-shaped core is inserted into the bobbin.

* * * * *